(12) United States Patent
van Sinderen et al.

(10) Patent No.: US 9,509,290 B2
(45) Date of Patent: Nov. 29, 2016

(54) FREQUENCY CONVERTER

(71) Applicant: NXP B.V., Eindhoven (NL)

(72) Inventors: Jan van Sinderen, Eindhoven (NL); Salvatore Drago, Eindhoven (NL)

(73) Assignee: NXP B.V., Eindhoven (NL)

( * ) Notice: Subject to any disclaimer, the term of this patent is extended or adjusted under 35 U.S.C. 154(b) by 0 days.

(21) Appl. No.: 14/702,884

(22) Filed: May 4, 2015

(65) Prior Publication Data
US 2015/0349755 A1    Dec. 3, 2015

(30) Foreign Application Priority Data

May 28, 2014 (EP) ..................... 14170243

(51) Int. Cl.
H03K 3/03 (2006.01)
H03D 7/12 (2006.01)
H03K 5/00 (2006.01)
H03D 7/16 (2006.01)

(52) U.S. Cl.
CPC ............ H03K 3/0315 (2013.01); H03D 7/125 (2013.01); H03D 7/165 (2013.01); H03K 5/00006 (2013.01); H03D 2200/0066 (2013.01); H03D 2200/0074 (2013.01)

(58) Field of Classification Search
CPC .......... H03D 7/12; H03D 7/125; H03D 7/16; H03D 7/163; H03D 7/165; H03D 2200/006; H03D 2200/0062; H03D 2200/0066; H03K 3/0315; H03K 5/00006
See application file for complete search history.

(56) References Cited

U.S. PATENT DOCUMENTS

| | | | |
|---|---|---|---|
| 5,262,735 A | 11/1993 | Hashimoto et al. | |
| 8,023,919 B2 * | 9/2011 | Lin | H04B 15/06 455/232.1 |
| 8,476,952 B2 * | 7/2013 | Shimizu | H03D 7/1441 327/231 |
| 8,606,210 B2 * | 12/2013 | Ru | H03D 7/14 455/280 |
| 8,838,057 B2 * | 9/2014 | Pullela | H03D 7/1466 455/302 |
| 9,030,264 B2 * | 5/2015 | Kawasoe | H03L 7/0802 331/57 |
| 2012/0008717 A1 | 1/2012 | van Sinderen et al. | |
| 2013/0257508 A1 | 10/2013 | Goel et al. | |
| 2014/0362957 A1 * | 12/2014 | Morishita | H03D 7/125 375/347 |

FOREIGN PATENT DOCUMENTS

| | | |
|---|---|---|
| EP | 2 048 776 A1 | 4/2009 |
| WO | 00/05815 | 2/2000 |
| WO | 2004/054092 A1 | 6/2004 |

OTHER PUBLICATIONS

Dai, Liang et al; "Comparison and Analysis of Phase Noise in Ring Oscillators"; ISCAS 2000—IEEE International Symposium on Circuits and Systems, Geneva, Switzerland; 4 pages (May 2000).
Soer, Michiel C.M. et al; "Unified Frequency Domain Analysis of Switched-Series-RC Passive Mixers and Samplers"; IEEE Transactions on Circuits and Systems—1 Regular Papers, vol. 57, No. 10; 14 Pages (Oct. 2010).

(Continued)

*Primary Examiner* — Ryan Johnson

(57) ABSTRACT

A frequency converter, comprising a multi-phase local oscillator and a multi-phase mixer. The mixer comprises a plurality of mixer switches, each connected to a respective amplifier. The local oscillator is configured to provide a switching signal to each mixer switch, and comprises a plurality of inverters configured as a ring oscillator.

14 Claims, 6 Drawing Sheets

(56) References Cited

OTHER PUBLICATIONS

Andrews, Caroline, et al; "A Passive Mixer-First Receiver with Digitally Controlled and widely tunable RF Interface"; IEEE Journal of Solid-State Circuits, vol. 45; Issue 12 (Dec. 2010).

Lee, Kyeongho et al; "A single-chip 2.4GHz Direct-Conversion CMOS Receiver for Wireless Local Loop using One-third Frequency Local Oscillator"; IEEE 2000 Symposium on VLSI Circuits, Honolulu, HI, US; 4 pages (Jun. 2000).

Extended European Search Report for Application No. 14179823.1 (Nov. 3, 2014).

\* cited by examiner

FREQUENCY CONVERTER

CROSS-REFERENCE TO RELATED APPLICATIONS

This application claims the priority under 35 U.S.C. §119 of European patent application no. 14170243.1, filed on May 28, 2014, the contents of which are incorporated by reference herein.

The invention relates to a frequency converter comprising a local oscillator and mixer, for instance for use in a radio receiver.

A low cost radio receiver with good performance is desired. A low power architecture is preferred, as is the ability to produce the receiver monolithically, for instance using a MOS (metal oxide semiconductor) process. In prior art high performance receivers, such as that described in EP2408118, an LC (inductor-capacitor) tank circuit is used to provide a local oscillator signal that is used by a mixer to shift the desired channel from the received radio frequency (RF) to an intermediate frequency (IF).

LC tank circuits are used in the prior art because of their relatively low phase noise. However, producing an LC tank circuit with the necessary tuning range and performance can be expensive, for instance because it tends to require a relatively large silicon area. One approach for achieving a broad tuning range is to use a varactor with a large tuning range or additional switched capacitors in the oscillator LC tank circuit, but this can result in increased noise, and require more power. An alternative approach, taught by EP2408118, is to use a reconfigurable mixer, but this approach still requires an LC tank oscillator that uses a relatively large silicon area.

Ring oscillators are an alternative way of providing a local oscillator signal, but existing ring oscillators have not typically been suitable for use in a frequency converter, due to their relatively high phase noise. Furthermore, existing ring oscillators may be unsuitable for use in a mixer because they provide an output that is overlapping, or with an inappropriate duty cycle. L. Dai and R. Harjani, "Comparison and analysis of phase noise in ring oscillators", IEEE International Symposium on Circuits and Systems (ISCAS), May 28-31, 2000, provides an overview of phase noise in ring oscillators and suggests how phase noise may be minimised.

It is an object of the invention to overcome at least some of the above mentioned problems.

According to the invention, there is provided a frequency converter, comprising a multi-phase local oscillator and a multi-phase mixer, wherein: the mixer comprises a mixer switch for each phase of the mixer; the local oscillator is configured to provide at least one oscillator phase to each mixer switch; and the local oscillator comprises a plurality of inverters configured as a ring oscillator.

One or more, or all, of the inverters may be inverting amplifiers.

The use of a local oscillator comprising a ring oscillator means that the need for an inductor is eliminated, which would be required in prior art LC tank based local oscillators. Inductors either consume relatively large amounts of die area, or require a component external to the die, and therefore increase the cost and size of the local oscillator. A ring oscillator is also advantageous because it has a large tuning range. The frequency can be adjusted by varying the capacitive load of the inverters and/or the bias voltage applied to the inverters.

The phases of the ring oscillator may be overlapping. The phases of the local oscillator may be non-overlapping. Multi-phase mixers typically require a non-overlapping multi-phase oscillator signal, so that only one of the mixer switches is closed at a time.

The local oscillator may have n phases, and the duty cycle of each phase may be 1/n. This type of output is particularly suitable for a typical multiphase mixer (but is not necessarily essential).

The mixer switch for each phase may comprise a plurality of transistors, each mixer switch being responsive to more than one phase of the local oscillator. Each mixer switch may be configured to be responsive to a logical combination of the phases of the local oscillator. This arrangement allows the mixer switches to be provided with an overlapping multi-phase local oscillator input without having more than one mixer switch closed at a time.

The mixer switches may be configured to operate at the same, a multiple or fraction of the frequency of the local oscillator phases. There may be the same number of mixer phases or fewer mixer phases than there are oscillator phases, or there may be more mixer phases than there are oscillator phases. The logical combination of local oscillator phases enables these arrangements. Logical operations previously performed in the local oscillator may be implemented within the mixer switches.

The ring oscillator may comprise 3, 5, 7, 9, 11, 13 or 15 inverters or inverting amplifiers.

The local oscillator may have an even number of phases or an odd number of phases. An odd number of phases may result in lower power requirements and use a smaller die area. An even number of phases may provide improved $2^{nd}$ order intermodulation performance in the frequency converter.

The multi-phase mixer may have an odd number of phases or an even number of phases.

The multi-phase mixer may have three phases.

Each phase of the local oscillator may be produced by an arrangement of logic gates connected to the inverters of the ring oscillator.

The arrangement of logic gates may be configured to produce a number of phases that is an integer multiple of the number of inverters in the ring oscillator. An even number of phases may thereby readily be produced from a ring oscillator having an odd number of inverters.

The arrangement of logic gates may be configured to produce phases with a frequency that is a multiple, or a fraction of a frequency of the ring oscillator.

The mixer may be configured as a sampling mixer.

The frequency converter may further comprise an inductor-capacitor network configured as an impedance matching stage, suitable for arranging between an antenna and the mixer.

The frequency converter may further comprise a circuit for converting a number of phases output from the mixer into a signal having a greater or lower number of phases. This approach can be used to provide a quadrature (either single ended or differential) intermediate frequency output from an odd-phase mixer.

BRIEF DESCRIPTION OF THE DRAWINGS

Embodiments of the invention will now be described, purely by way of example, with reference to the accompanying drawings, in which.

DETAILED DESCRIPTION

Figure 1:
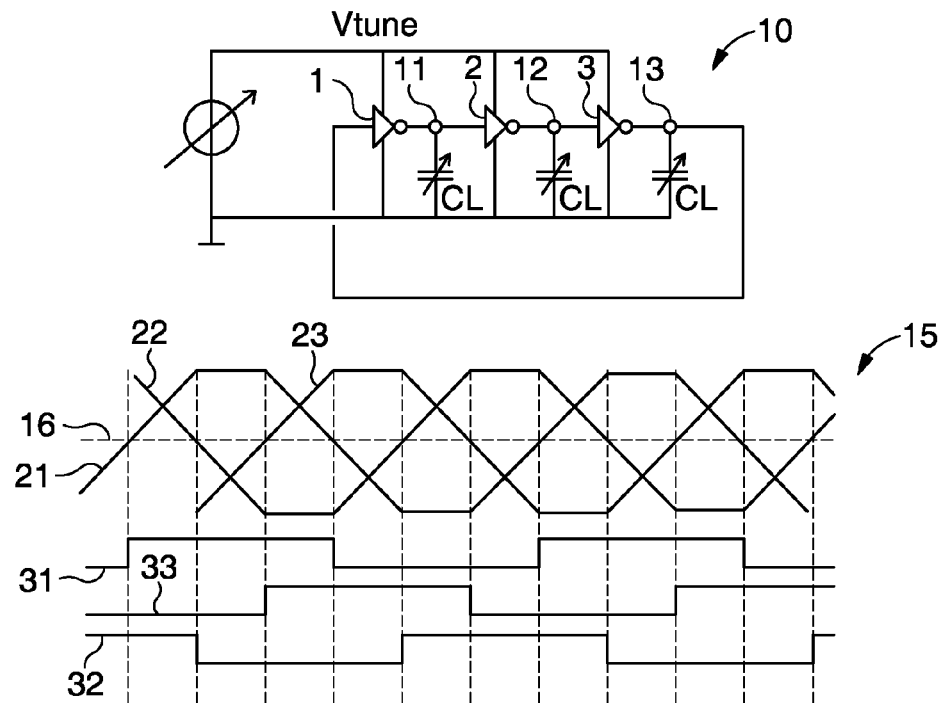
FIG. 1 is a schematic of a three inverter ring oscillator, shown with a voltage trace illustrating the voltage at various locations in the circuit.

Referring to FIG. 1, a ring oscillator 10 is shown, comprising a first inverter 1, second inverter 2 and third inverter 3. The inverters 1, 2, 3 are connected in series, with the output of the first inverter 1 connected to the input of the second inverter 2, and the output of the second inverter 2 connected to the input of the third inverter 3. The output of the third inverter 3 is connected to the input of the first inverter 1. Connected between the output of each inverter 1, 2, 3 and ground is a capacitive load CL, and each inverter is supplied with a bias voltage Vtune. The frequency of the ring oscillator 10 may be varied by adjusting the bias voltage Vtune and/or the capacitive loads CL. For example the frequency of the ring oscillator 10 may be decreased by increasing the size of the capacitive load CL on each inverter 1, 2, 3, or by reducing the bias voltage Vtune.

FIG. 1 also includes a graph 15, showing the analogue voltages 21, 22, 23 at the output 11, 12, 13 of each respective inverter. The loading capacitor CL connected to the output of each inverter 11, 12, 13 is charged and discharged as the inverter is switched. The analogue voltages 21, 22, 23 can be converted to digital waveforms 31, 32, 33, with reference to a threshold voltage 16 (for instance using a logic gate). The digital waveforms 31, 32, 33 from the output of each inverter 1, 2, 3 have a frequency equal to the ring oscillator frequency, and have a 50% duty cycle. In this case, since the inverters 1, 2, 3 and their respective capacitive loads CL are nominally identical, the waveforms 31, 33, 32 are respectively offset by 120° in phase, so that waveform 31 is at 0°, waveform 33 is at 120°, and waveform 32 is at 240°.

In order to be useful in a mixer, it may be necessary (in some cases) to produce non-overlapping multi-phase oscillator signals. This can be achieved by performing logical operations on the output voltage of each inverter 1, 2, 3.

Figure 2:
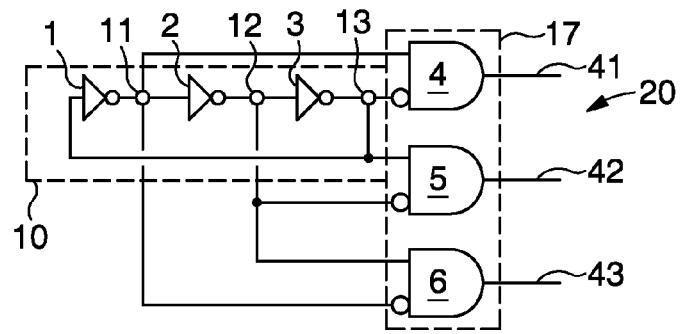
FIG. 2 is a schematic of a three inverter ring oscillator with an arrangement of logic gates for producing a non-overlapping three phase local oscillator signal.
Figure 3:
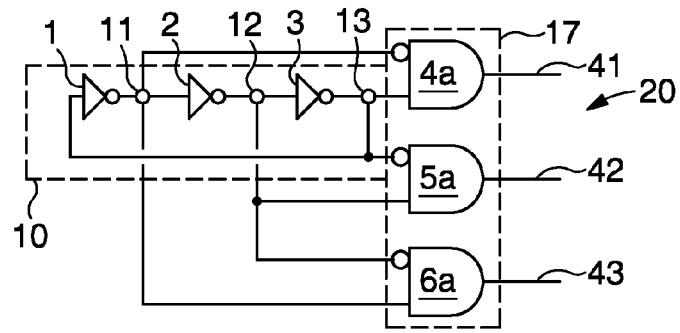
FIG. 3 is a schematic of a three inverter ring oscillator with an alternative arrangement of logic gates for producing a non-overlapping three phase local oscillator signal.

FIGS. 2 and 3 each show a multi-phase local oscillator 20 comprising a ring oscillator 10 and an arrangement of logic gates 17. The logic gates 17 are connected to the outputs of three inverters 1, 2, 3 of the ring oscillator 10. The logic gates 17 are arranged to produce outputs 41, 42, 43 comprising three non-overlapping phases, at 0°, 120° and 240°, and having duty cycles of 1/n (where n is the number of inverters, i.e. 3 in this case).

In FIG. 2 a first AND gate 4 has a non-inverting input connected to the output 11 of inverter 1, and an inverting input connected to the output 13 of inverter 3. A second AND gate 5 has a non-inverting input connected to the output 13 of inverter 3, and an inverting input connected to the output 12 of inverter 2. A third AND gate has a non-inverting input connected to the output 12 of inverter 2, and an inverting input connected to the output 11 of inverter 1.

In FIG. 3 a similar arrangement is shown, but each AND gate is replaced by a NAND gate and the sense of the inputs inverted, so that an inverting input becomes a non-inverting input and a non-inverting input becomes an inverting input. A first NAND gate 4a has an inverting input connected to the output 11 of inverter 1, and a non-inverting input connected to the output 13 of inverter 3. A second NAND gate 5a has an inverting input connected to the output 13 of inverter 3, and a non-inverting input connected to the output 12 of inverter 2. A third NAND gate has an inverting input connected to the output 12 of inverter 2, and a non-inverting input connected to the output 11 of inverter 1. This arrangement is functionally the same as that of FIG. 2, and will result in the same output waveforms at the corresponding logic gates: 4, 4a; 5, 5a; 6, 6a.

The specific arrangements of logic gates shown in the embodiments of FIGS. 2 and 3 are examples only, and it will be appreciated that a range of alternative arrangements are possible for achieving a similar result.

The number of inverters in the ring oscillator may be different. There may be an even number of inverters, or an odd number. The number of inverters may be 5, 7, 9, 11, 13, 15 or more.

Figure 4:
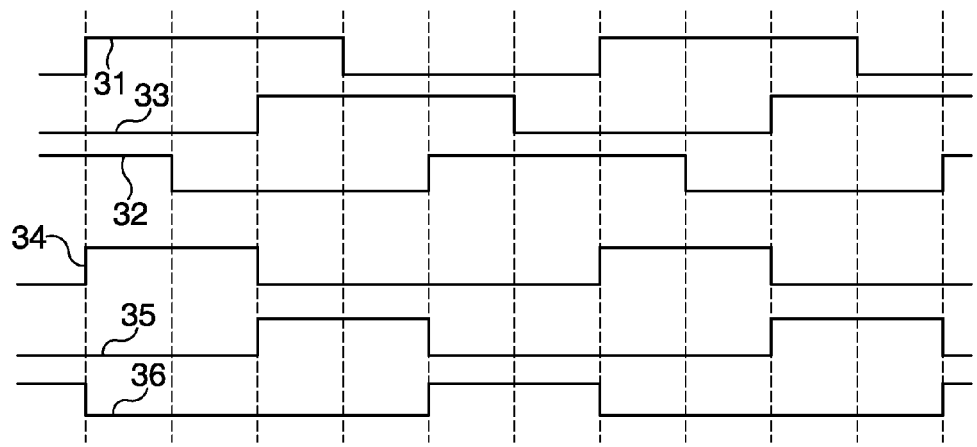
FIG. 4 is a graph showing the three phase local oscillator output waveform produced by the circuit of FIG. 2 or 3 with reference to the outputs of the three inverters of the ring oscillator.

FIG. 4 shows the output waveforms 34, 35, 36 of the outputs 41, 42, 43 of the respective AND gates 4, 5, 6 (and of NAND gates 4a, 5a, 6a), with reference to the digital voltages of the inverters 1, 2, 3.

Figure 5:
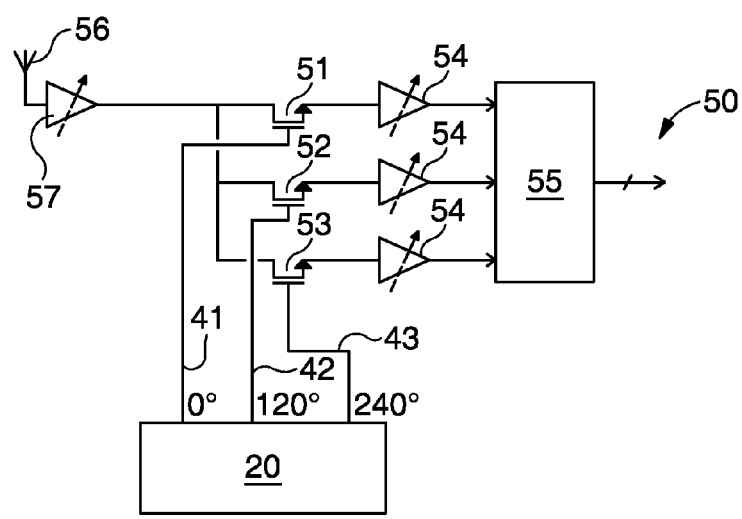
FIG. 5 is a circuit schematic of a three phase mixer receiver comprising a local oscillator producing a three phase non overlapping output, coupled to a 3 phase ADC via three mixer switches.

FIG. 5 shows a frequency converter 50, comprising an antenna 56, low noise amplifier (LNA) 57, local oscillator 20, mixer switches 51, 52, 53, intermediate frequency (IF) amplifiers 54 and a three phase analogue to digital converter (ADC) 55.

The antenna 56 receives the radio frequency (RF) modulated signal, and provides the RF signal to the LNA 57.

The local oscillator 20 is a three phase local oscillator, producing non-overlapping outputs 41, 42, 43 at 0°, 120° and 240°, each having a duty cycle of ⅓.

The mixer switches 51, 52, 53 are n-channel transistors, having their respective gates connected to the three phase oscillator outputs 41, 42, 43, and their drains (sources) connected to the output of the LNA 57. The source (drain) of the transistor of each mixer switch 51, 52, 53 is connected to the ADC 55 via a respective IF amplifier 54. Each mixer switch 51, 52, 53 is therefore switched at the local oscillator frequency at a different phase, and only one mixer switch is on at any given time, due to the non-overlapping local oscillator signals. It will be appreciated that other arrangements can be used for the mixer switch, and it is not essential that n-channel transistors are used.

The LNA 57 may be a voltage amplifier or a transconductance amplifier (voltage to current). The IF amplifiers 54 may be trans-impedance (current to voltage) amplifiers, or voltage amplifiers.

Figure 6:
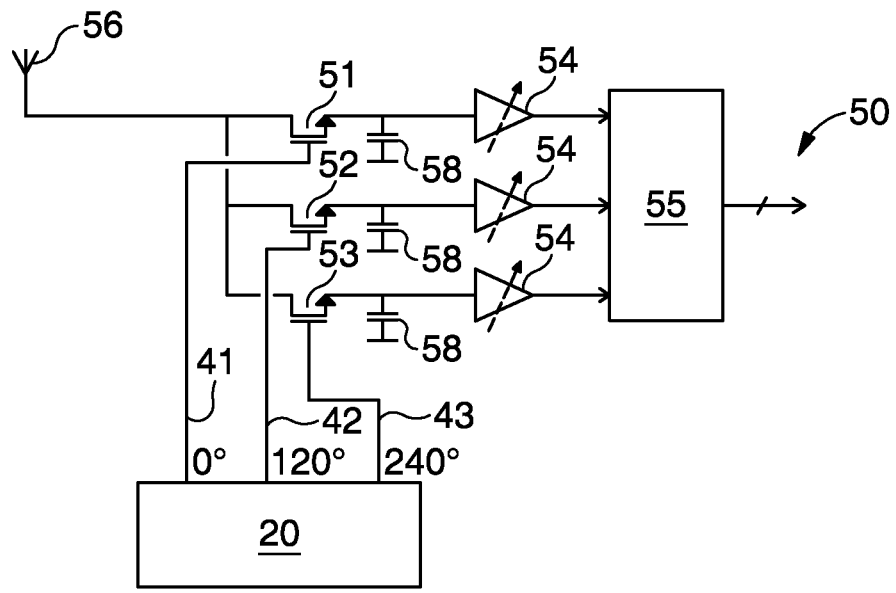
FIG. 6 is a circuit schematic of a three phase mixer receiver similar to that of FIG. 5, in which the mixer is a sampling mixer.

FIG. 6 shows an alternative frequency converter 50, in which the mixer is configured as a sampling mixer by the inclusion of sampling capacitors 58 connected between ground and the source of the transistor of each mixing switch 51, 52, 53.

Figure 7:
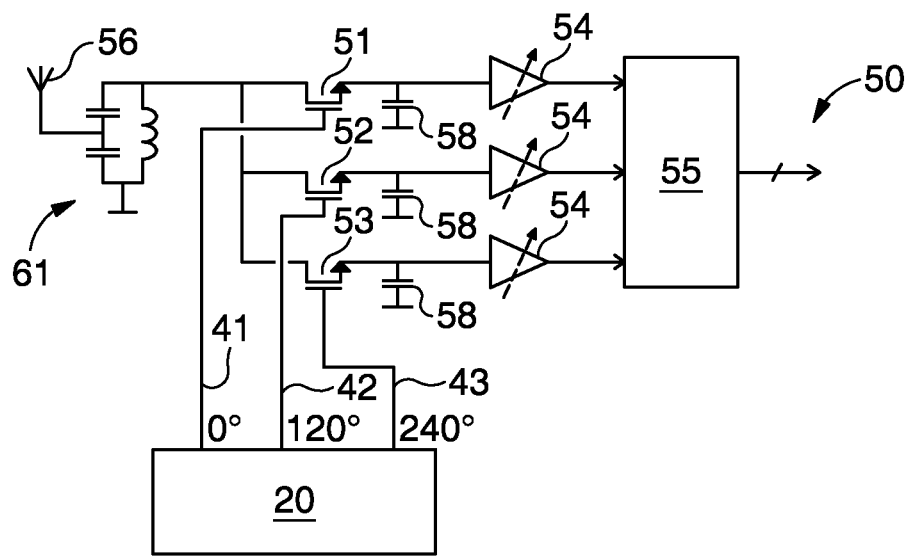
FIG. 7 is a circuit schematic of a three phase mixer similar to that of FIG. 6, in which an LC impedance matching network is arranged between an antenna and the mixer switches.

The LNA 57 can be omitted. In some embodiments the antenna 56 may be connected to the mixer switches 51, 52, 53 via an LC matching network 61, as shown in FIG. 7. In FIG. 7 the mixer 51, 52, 53 is again configured as a sampling or sub-sampling mixer. This arrangement produces relatively high input linearity, especially out-of-band, and/or relatively low power consumption.

Figure 8:
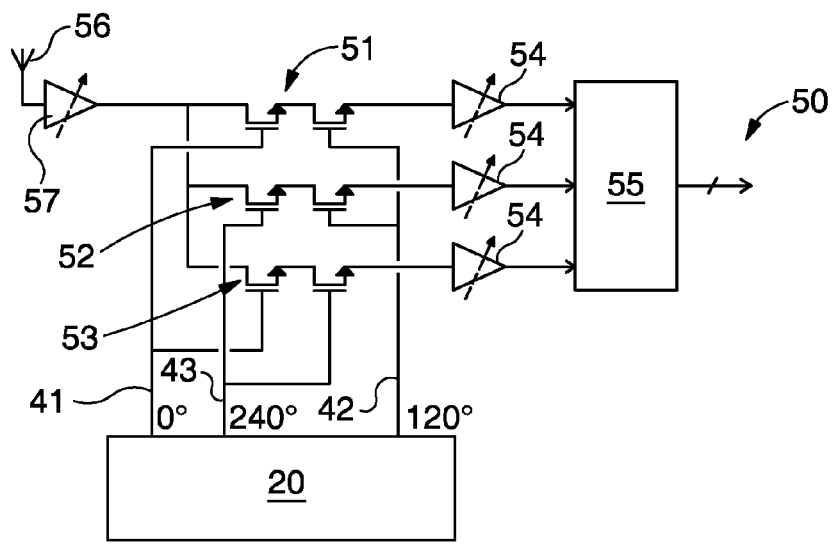
FIG. 8 is a circuit schematic of a three phase mixer in which each mixer switch comprises a series combination of transistors, and each mixer switch is responsive to more than one local oscillator phase.

FIG. 8 shows an alternative frequency converter 50, in which the local oscillator 20 provides three phase outputs 41, 42, 43, respectively having phases of 0°, 120° and 240°. However, in this embodiment the outputs 41, 42, 43 are overlapping and they have a 50% duty cycle, and the mixer switches 51, 52, 53 are configured to perform the necessary logical operations such that their switching is non-overlapping.

Each mixer switch 51, 52, 53 comprises a series arrangement of a p channel and n channel transistor.

Mixer switch 51 comprises an n channel metal oxide semiconductor transistor (NMOST) in series combination with a p channel transistor (PMOST). The first phase 41 of the local oscillator 20 is connected to the gate of the NMOST of the switch 51, and the second phase 42 of the local oscillator 20 is connected to the gate of the PMOST of the switch 51.

Mixer switch 52 comprises a p channel metal oxide semiconductor transistor (PMOST) in series combination with an n channel transistor (NMOST). The third phase 43 of the local oscillator 20 is connected to the gate of the PMOST of the switch 52, and the second phase 42 of the local oscillator is connected to the gate of the NMOST of the switch 52.

Mixer switch 53 comprises a p channel metal oxide semiconductor transistor (PMOST) in series combination with an n channel transistor (NMOST). The first phase 41 of the local oscillator 20 is connected to the gate of the PMOST of the switch 53, and the third phase 43 of the local oscillator is connected to the gate of the NMOST of the switch 53.

Both NMOST and PMOST transistors must be switched on for each mixer switch 51, 52, 53 to be switched on, and the series combination of NMOST and PMOST in each mixer switch 51, 52, 53 therefore provides the necessary logical operations such that their switching is non-overlapping, even though the local oscillator 20 provides phases which overlap. It will be appreciated that the series position of the NMOST and PMOST in each switch 51, 52, 53 can be reversed.

One drawback of an odd-phase mixer (for example having three phases) is their limited even order intermodulation performance (i.e. $2^{nd}$ order). It is possible to derive, using combinatory logic, a non-overlapping 2×N phase signal from a ring oscillator having N inverters (for example with N=3, 5, 7, 9, etc). It will be appreciated that the necessary combinatory logic can be implemented in the local oscillator, and/or the mixer, as in the example of FIG. 8. An example of AND/NAND functionality has been shown using series combinations of NMOST and PMOST, and OR functionality can similarly be implemented in the mixer switches using parallel combinations of transistors. The combinatory logic shown herein with reference to the local oscillator can be partly or fully implemented in the mixer, rather than the local oscillator.

Figure 9:
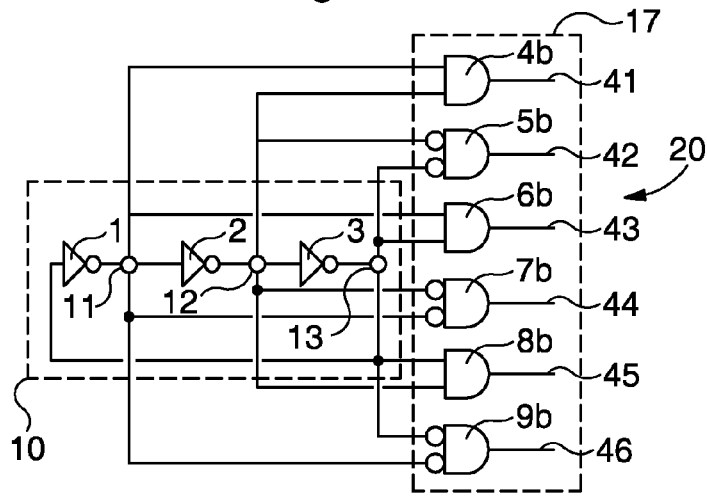
FIG. 9 is a schematic of a three inverter ring oscillator with an arrangement of logic gates for producing a non-overlapping six phase local oscillator signal at twice the local oscillator frequency.

FIG. 9 shows an example local oscillator 20 in which an arrangement 17 of logic gates is configured to produce a six phase, non-overlapping signal from a ring oscillator 10 having three inverters. AND gate 4b has first and second non-inverting inputs, respectively connected to the outputs of the first and second inverters 11, 12. AND gate 5b has first and second inverting inputs, respectively connected to the outputs of the second and third inverters 12, 13. AND gate 6b has first and second non-inverting inputs, respectively connected to the outputs of the first and third inverters 11, 13. AND gate 7b has first and second inverting inputs, respectively connected to the outputs of the second and first inverters 12, 11. AND gate 8b has first and second non-inverting inputs, respectively connected to the outputs of the third and second inverters 13, 12. AND gate 9b has first and second inverting inputs, respectively connected to the outputs of the third and first inverters 13, 11.

Figure 10:
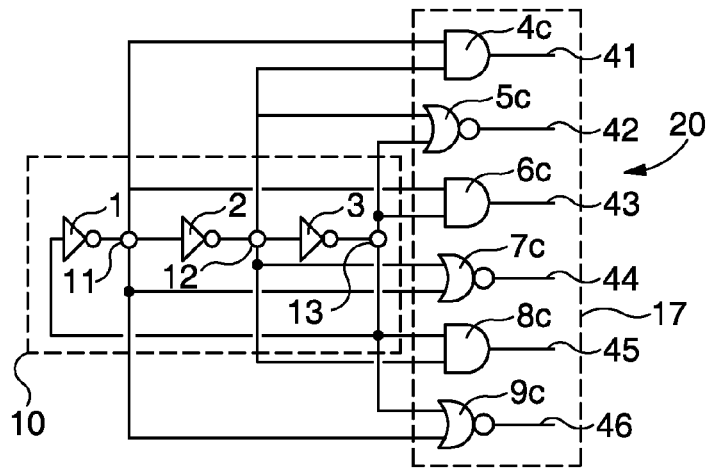
FIG. 10 is a schematic of a three inverter ring oscillator with an alternative arrangement of logic gates for producing a non-overlapping six phase local oscillator signal at twice the local oscillator frequency.

FIG. 10 shows an alternative local oscillator 20 in which an arrangement 17 of logic gates is configured to produce a six phase, non-overlapping signal from a ring oscillator 10 having three inverters. In this arrangement, the arrangement of logic gates is the same, except that each AND gate 5b, 7b, 9b with inverting inputs has respectively been replaced with a NOR gate 5c, 7c, 9c with non-inverting inputs. Since these two types of logic gate have identical truth tables, the arrangements of FIGS. 9 and 10 are functionally equivalent.

Figure 11:
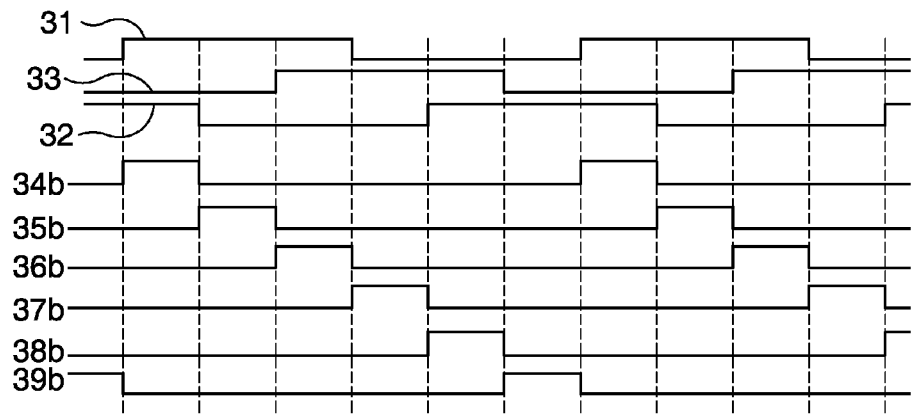
FIG. 11 is a graph showing the six phase local oscillator output waveform produced by the circuits of FIG. 9 or 10 with reference to the outputs of the three inverters of the ring oscillator.

FIG. 11 shows the output waveforms 34b, 35b, 36b, 37b, 38b, 39b of the outputs 41, 42, 43, 44, 45, 46 of the respective logic gates 4b, 5b, 6b, 7b, 8b, 9b (and of logic gates 4c, 5c, 6c, 7c, 8c, 9c). The duty cycle of each waveform 34b-39b is ⅙. Waveform 34b is at 0° phase, waveform 35b is at 60° phase, waveform 36b is at 120° phase, waveform 37b is at 180° phase, waveform 38b is at 240° phase, and waveform 39b is at 300° phase. It will be understood that this type of combinatorial logic can be implemented within the mixer, for instance to provide a mixer with a greater number of phases than the local oscillator. For instance, the local oscillator may have three phases, and provide two phases to each of six mixer switches, which perform logical operations similar to those described with reference to FIGS. 9 and 10.

It is also possible to use combinatory logic to create fewer phases with higher frequency (i.e. at a multiple of the ring oscillator frequency). This technique can be beneficial if the desired local oscillator frequency is higher than the maximum output frequency of the ring oscillator. An example approach is to combine two phases that have 180° phase difference and a duty-cycle less than 50%, using OR gates, resulting in half the number of non-overlapping phases at twice the frequency.

Figure 12:
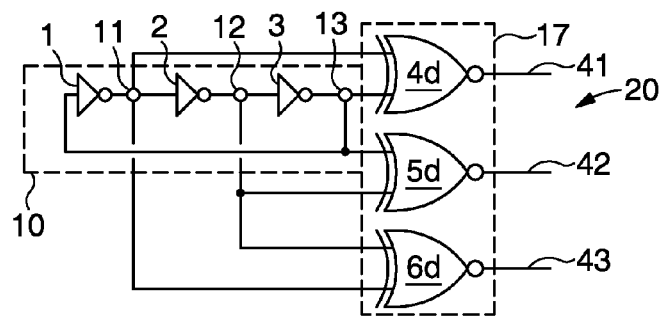
FIG. 12 is a schematic of a three inverter ring oscillator with an arrangement of logic gates for producing a non-overlapping three phase local oscillator signal at twice the local oscillator frequency.

An alternative arrangement is to use different combinatory logic 17, as shown in the example of FIG. 12. In this embodiment three XNOR gates 4d, 5d, 6d are used to produce three non-overlapping phases from a ring oscillator 10 comprising three inverters. Each phase output 41, 42, 43 from the XNOR gates 4d, 5d, 6d is at twice the frequency of the ring oscillator 10 and has a duty cycle of ⅓. XNOR gate 4d has two non-inverting inputs, respectively connected to the outputs of the first and third inverters 11, 13. XNOR gate 5d has two non-inverting inputs, respectively connected to the outputs of the third and second inverters 13, 12. XNOR gate 6d has two non-inverting inputs, respectively connected to the outputs of the second and first inverters 12, 11. Again, it is possible to perform these type of logical operations within the mixer, so that the mixer responds at a frequency that is different to that of the local oscillator (e.g. at a multiple or fraction of the frequency thereof).

Figure 13:
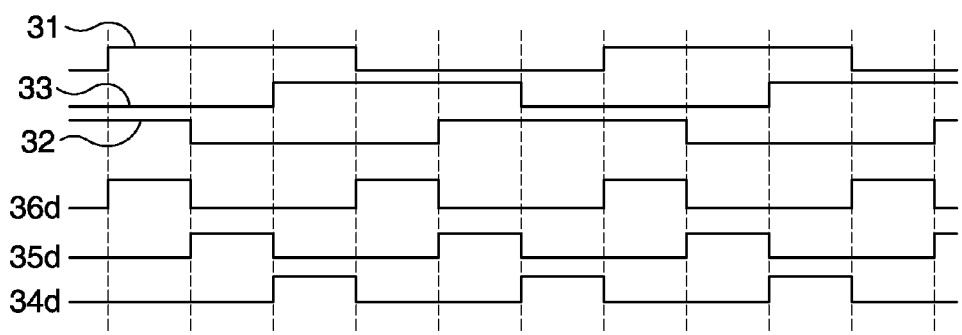
FIG. 13 is a graph showing the three phase local oscillator output waveform produced by the circuit of FIG. 12 with reference to the outputs of the three inverters of the ring oscillator.

FIG. 13 shows the output waveforms 34d, 35d, 36d of the outputs 41, 42, 43 of the respective XNOR gates 4d, 5d, 6d. The duty cycle of each waveform 34d-36d is ⅓. Waveform 34d is at 0° phase, waveform 35d is at 120° phase, and waveform 36d is at 240° phase.

Figure 14:
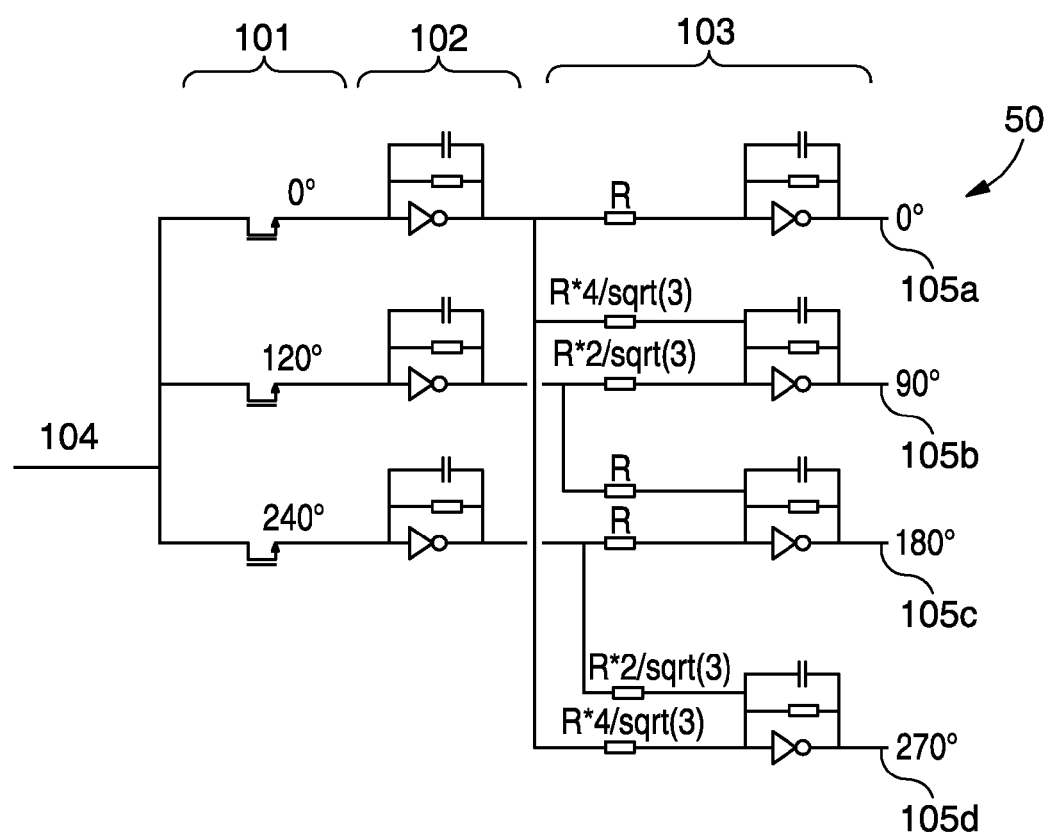
FIG. 14 is a schematic of a circuit for converting a three phase mixer output to a four phase quadrature signal.

Multi-phase mixer outputs (where the number of phases is equal or greater than three) can be converted into any other number of phases, as has been described in EP2408118. For example, FIG. 14 shows a frequency converter 50 comprising a three phase mixer 101, transimpedence amplifiers 102 and a weighted summing network 103. The three-phase mixer 101 comprises a three-phase local oscillator based on a ring oscillator, which mixes the RF signal 104 to produce three phases of intermediate frequency signals. These three phases are amplified by the transimpedence amplifiers 102 and provided to the weighted summing network, and produces intermediate frequency outputs 105a, 105b, 105c, 105d, having respective phase angles of 0°, 90°, 180° and 270° (i.e. a four phase quadrature signal). The weighted summing network 103 may be passive. The weighted summing network 103 may be implemented at the virtual ground inputs of a quadrature delta-sigma ADC.

In some arrangements it may be more desirable to use a circuit with an odd number of phase inputs and outputs. This can be more efficient for both power and silicon area.

Other embodiments are intentionally within the scope of the invention as defined by the appended claims.

The invention claimed is:

1. A frequency converter, comprising a multi-phase local oscillator and a multi-phase mixer, wherein:

the mixer comprises a mixer switch for each phase of the mixer and each said mixer switch is configured to receive an RF input signal;

the local oscillator is configured to provide at least one oscillator phase to each mixer switch;

the local oscillator comprises a plurality of inverters configured as a ring oscillator; and the mixer switch for at least one phase comprises a plurality of transistors, said at least one mixer switch being responsive to more than one phase of the local oscillator; and wherein each mixer switch is configured to be responsive to a logical combination of the phases of the local oscillator.

2. The frequency converter of claim 1, wherein the phases of the local oscillator are non-overlapping.

3. The frequency converter of claim 2, wherein there the local oscillator has n phases, and the duty cycle of each phase is 1/n.

4. The frequency converter of claim 1, wherein the mixer switch for each phase comprises a plurality of transistors, each mixer switch being responsive to more than one phase of the local oscillator.

5. The frequency converter of any claim 1, wherein the mixer switches are configured to operate at a multiple or a fraction of the local oscillator frequency.

6. The frequency converter of claim 1, wherein the number of mixer phases is different than the number of local oscillator phases.

7. The frequency converter of claim 1, wherein the multi-phase mixer has an odd number of phases or an even number of phases.

8. The frequency converter of claim 1, wherein the multi-phase mixer has three phases.

9. The frequency converter of claim 1, wherein each phase of the local oscillator is produced by an arrangement of logic gates connected to the inverters of the ring oscillator.

10. The frequency converter of claim 9, wherein the arrangement of logic gates is configured to produce a number of phases that is an integer multiple of the number of inverters in the ring oscillator.

11. The frequency converter of claim 9, wherein the arrangement of logic gates is configured to produce phases with a frequency that is a multiple or a fraction of a frequency of the ring oscillator.

12. The frequency converter of claim 1, wherein the mixer is configured as a sampling mixer.

13. The frequency converter of claim 1, further comprising an inductor-capacitor network configured as an impedance matching stage, suitable for arranging between an antenna and the mixer.

14. The frequency converter of claim 1, further comprising a circuit for converting a number of phases output from the mixer into a signal having a greater or smaller number of phases.

* * * * *